(12) United States Patent
Miyamoto et al.

(10) Patent No.: US 11,437,520 B2
(45) Date of Patent: Sep. 6, 2022

(54) TRANSISTOR AND DISPLAY DEVICE

(71) Applicant: SHARP KABUSHIKI KAISHA, Sakai (JP)

(72) Inventors: Tadayoshi Miyamoto, Sakai (JP); Yoshinobu Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 72 days.

(21) Appl. No.: 17/042,900

(22) PCT Filed: Mar. 30, 2018

(86) PCT No.: PCT/JP2018/013810
§ 371 (c)(1),
(2) Date: Sep. 28, 2020

(87) PCT Pub. No.: WO2019/187069
PCT Pub. Date: Oct. 3, 2019

(65) Prior Publication Data
US 2021/0057583 A1   Feb. 25, 2021

(51) Int. Cl.
| H01L 27/00 | (2006.01) |
| H01L 29/00 | (2006.01) |
| H01L 29/786 | (2006.01) |
| H01L 23/522 | (2006.01) |
| H01L 27/12 | (2006.01) |
| H01L 29/66 | (2006.01) |

(52) U.S. Cl.
CPC .... *H01L 29/78633* (2013.01); *H01L 23/5225* (2013.01); *H01L 23/5226* (2013.01); *H01L 27/124* (2013.01); *H01L 29/66969* (2013.01); *H01L 27/1225* (2013.01); *H01L 29/7869* (2013.01)

(58) Field of Classification Search
CPC ............ H01L 23/5226; H01L 23/5225; H01L 23/481; H01L 23/52; H01L 27/124; H01L 27/1225; H01L 27/1249; H01L 27/1248; H01L 27/1281; H01L 29/66969; H01L 29/78633; H01L 29/7869
See application file for complete search history.

(56) References Cited

U.S. PATENT DOCUMENTS

| 2012/0153289 A1 | 6/2012 | Kaneko |
| 2017/0075155 A1 | 3/2017 | Oikawa et al. |
| 2018/0151595 A1 | 5/2018 | Saitoh et al. |

FOREIGN PATENT DOCUMENTS

| JP | 2010-117399 A | 5/2010 |
| JP | 2010-210732 A | 9/2010 |
| JP | 2017-054124 A | 3/2017 |
| WO | 2011/027705 A1 | 3/2011 |
| WO | 2016/199680 A1 | 12/2016 |

*Primary Examiner* — Nikolay K Yushin
(74) *Attorney, Agent, or Firm* — ScienBiziP, P.C.

(57) ABSTRACT

The transistor includes a first insulating film, an oxide semiconductor layer, a gate insulating film, an upper gate electrode, and a second insulating film being sequentially layered on a substrate, and the transistor includes a light blocking layer layered on the second insulating film and formed of metal. The light blocking layer is electrically connected to the upper gate electrode by interposing a gate contact hole provided in the second insulating film. The oxide semiconductor layer is configured such that a region overlapping with the upper gate electrode entirely overlaps with the light blocking layer.

13 Claims, 8 Drawing Sheets

TRANSISTOR AND DISPLAY DEVICE

TECHNICAL FIELD

The disclosure relates to a transistor in which layers are layered on a substrate, and to a display device including a transistor.

BACKGROUND ART

In recent years, products equipped with organic electroluminescence (EL) display devices have spread with the advance in organic light-emitting diode (OLED) technology. In addition, the reduction of variations in characteristics is strongly demanded in thin film transistors (TFTs) for backplanes of OLEDs. For example, the incident of light increases the effect of photoelectric conversion in a semiconductor layer to cause abnormality in a TFT, which has been known as the cause of variations in characteristics, and measures against this problem are proposed.

CITATION LIST

Patent Literature

PTL 1: JP 2010-210732 A

SUMMARY

Technical Problem

A liquid crystal display panel described in PTL 1 is configured such that a light-blocking film, a first insulating film (buffer insulating film), a semiconductor layer, a second insulating film (gate insulating film), a gate electrode, a third insulating film (interlayer insulating film), and a drain electrode and a source electrode are sequentially layered on a transparent substrate. In this configuration, the light from below the semiconductor layer can be blocked, however, there is no consideration for the light from above the semiconductor layer.

The disclosure is made in order to solve the problem described above, and an object of the disclosure is to provide a transistor capable of blocking light incident into an oxide semiconductor layer and achieving stable characteristics, and a display device including a transistor.

Solution to Problem

A transistor according to an aspect of the disclosure is a transistor including a first insulating film, an oxide semiconductor layer, a gate insulating film, an upper gate electrode, and a second insulating film being sequentially layered on a substrate, the transistor including a light blocking layer layered on the second insulating film and formed of metal. The light blocking layer is electrically connected to the upper gate electrode by interposing a gate contact hole provided in the second insulating film, and the oxide semiconductor layer is configured such that a region overlapping with the upper gate electrode entirely overlaps with the light blocking layer.

The transistor according to an aspect of the disclosure may include a source electrode and a drain electrode electrically connected to the oxide semiconductor layer by interposing a conductor contact hole provided in the second insulating film. The light blocking layer may be formed in the same layer as the source electrode and the drain electrode in a layered thickness direction.

The transistor according to an aspect of the disclosure may include a third insulating film layered on the second insulating film, and a source electrode and a drain electrode electrically connected to the oxide semiconductor layer by interposing a conductor contact hole provided in the second insulating film and the third insulating film.

In the transistor according to an aspect of the disclosure, the source electrode and the drain electrode may be provided with regions overlapping with the light blocking layer in plan view.

In the transistor according to an aspect of the disclosure, the gate contact hole may overlap with a channel region of the oxide semiconductor layer.

In the transistor according to an aspect of the disclosure, the upper gate electrode may be extended to the outer side of a channel region of the oxide semiconductor layer, and the gate contact hole may overlap with a portion of the upper gate electrode extended to the outer side of the channel region of the oxide semiconductor layer.

In the transistor according to an aspect of the disclosure, the upper gate electrode and the gate insulating film may be aligned in plan view.

In the transistor according to an aspect of the disclosure, a lower gate electrode facing to the oxide semiconductor layer by interposing the first insulating film may be formed below the oxide semiconductor layer, and the lower gate electrode may overlap with a channel region of the oxide semiconductor layer in plan view.

In the transistor according to an aspect of the disclosure, the light blocking layer may be formed protruding outward of a region where the upper gate electrode and the oxide semiconductor layer overlap with each other in plan view.

In the transistor according to an aspect of the disclosure, the light blocking layer may be formed in an island shape corresponding to the oxide semiconductor layer.

A display device according to an aspect of the disclosure includes the transistor according to an aspect of the disclosure, the display device including a display region formed with a plurality of pixel circuits corresponding to a plurality of pixels. Each of the plurality of pixel circuits includes a drive transistor formed of the transistor.

In the display device according to an aspect of the disclosure, the light blocking layer may be a gate wiring line.

In the display device according to an aspect of the disclosure, the upper gate electrode may be a gate wiring line.

The display device according to an aspect of the disclosure may be a semi-transparent display device.

Advantageous Effects of Disclosure

According to an aspect of the disclosure, the light blocking layer is provided, and thus the light incident into the oxide semiconductor layer directly below the upper gate electrode can be blocked, and stable characteristics can be achieved. In addition, the light blocking layer is electrically connected to the upper gate electrode, and the same potential as the upper gate electrode is applied, therefore, a floating electrode is avoided from being formed.

DESCRIPTION OF EMBODIMENTS

First Embodiment

Hereinafter, a transistor according to a first embodiment of the disclosure will be described with reference to the drawings.

Figure 1:
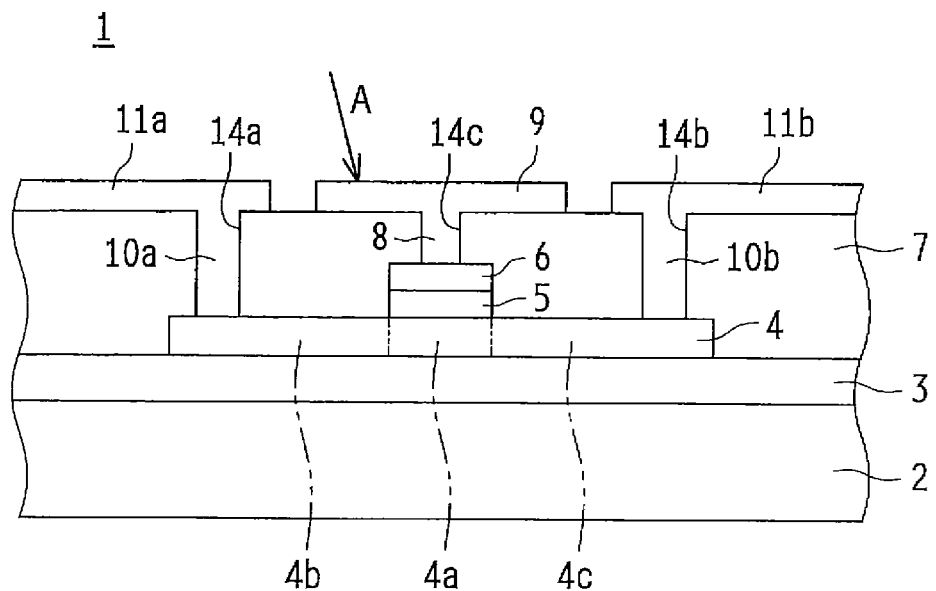
FIG. 1 is a schematic cross-sectional view schematically illustrating a transistor according to a first embodiment of the disclosure.
Figure 2:
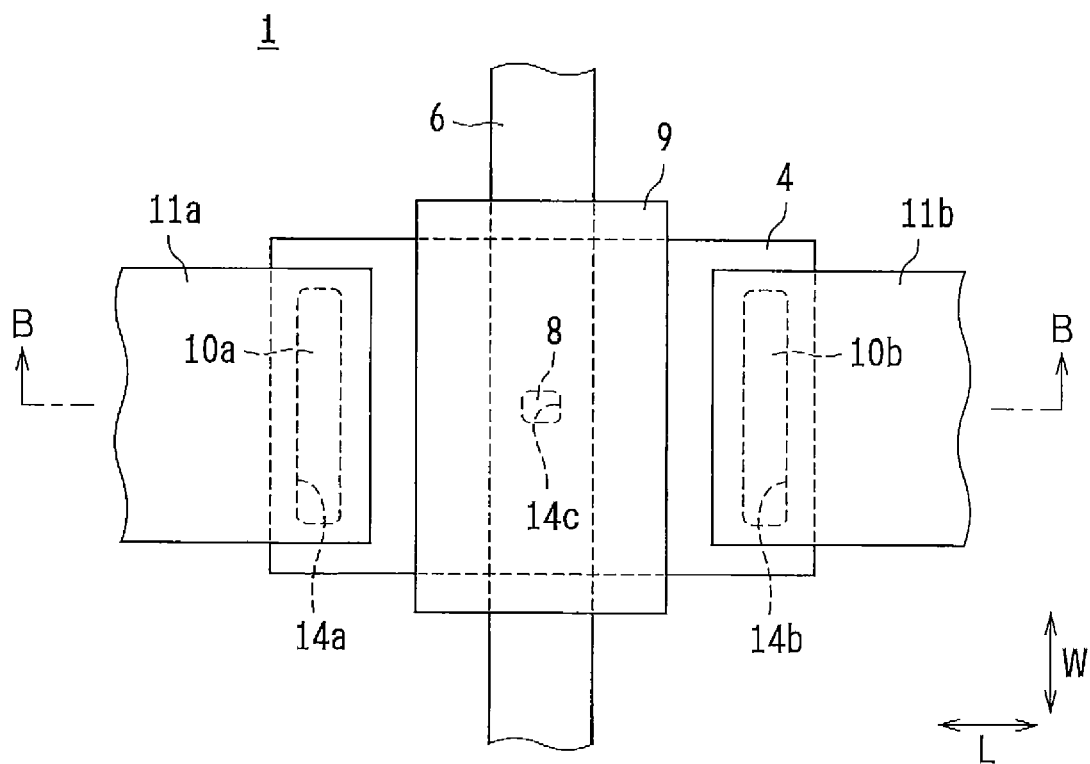
FIG. 2 is a schematic plan view schematically illustrating the transistor illustrated in FIG. 1.

FIG. 1 is a schematic cross-sectional view schematically illustrating the transistor according to the first embodiment of the disclosure. FIG. 2 is a schematic plan view schematically illustrating the transistor illustrated in FIG. 1. Note that, in consideration of the visibility of the drawings, hatching is omitted in FIG. 1, and a second insulating film 7 is transparently illustrated in FIG. 2. In addition, FIG. 1 illustrates a cross-section taken along the arrow B-B in FIG. 2.

A transistor 1 (thin film transistor: TFT) according to the first embodiment of the disclosure is formed such that a first insulating film 3, an oxide semiconductor layer 4, a gate insulating film 5, an upper gate electrode 6, and a second insulating film 7 are sequentially layered on a substrate 2. Note that a manufacturing process of the transistor 1 and details of each part will be described with reference to FIGS. 3A to 3D described below.

FIGS. 1 and 2 illustrates an enlarged view of one transistor 1 formed on the substrate 2, and a plurality of transistors 1 may be further formed on the substrate 2. The first insulating film 3 is formed to cover the entire substrate 2. The oxide semiconductor layer 4 is provided on the first insulating film 3 and is disposed on each of the transistors 1. In other words, the oxide semiconductor layer 4 is separately provided from the oxide semiconductor layer 4 of other transistors 1. The oxide semiconductor layer 4 includes a channel region 4a, and a source region 4b and a drain region 4c which are located on opposite sides of the channel region 4a. The source region 4b and the drain region 4c are regions where the resistance of the oxide semiconductor is reduced, and the channel region 4a is a region where the resistance of the oxide semiconductor is not reduced.

The gate insulating film 5 is provided on the oxide semiconductor layer 4 and overlaps with the channel region 4a of the oxide semiconductor layer 4. The upper gate electrode 6 is provided on the gate insulating film 5 and opposed to the channel region 4a by interposing the gate insulating film 5. The positional relationship between the upper gate electrode 6 and the gate insulating film 5 will be described in detail with reference to FIGS. 3B and 3C described below.

The second insulating film 7 is formed covering the oxide semiconductor layer 4 and the upper gate electrode 6. In the transistor 1, a source electrode 11a (left side in FIG. 2), a drain electrode 11b (right side in FIG. 2), and a light blocking layer 9 are provided on the second insulating film 7.

The source electrode 11a is electrically connected to the source region 4b of the oxide semiconductor layer 4 by interposing a source contact portion 10a (corresponding to a first conductor contact hole 14a described below) provided in the second insulating film 7.

The drain electrode 11b is electrically connected to the drain region 4c of the oxide semiconductor layer 4 by interposing a drain contact portion 10b (corresponding to a second conductor contact hole 14b described below) provided in the second insulating film 7.

The light blocking layer 9 is electrically connected to the upper gate electrode 6 by interposing a gate contact portion 8 (corresponding to a gate contact hole 14c described below) provided in the second insulating film 7. For the sake of description below, in a plan view (see FIG. 2), the direction in which the source electrode 11a and the drain electrode 11b are opposed to each other (the left-right direction in FIG. 2) may be referred to as a channel length direction L, and the direction orthogonal to the channel length direction L (the up-down direction in FIG. 2) may be referred to as a channel width direction W.

Next, the manufacturing process of the transistor 1 will be described in detail with reference to FIGS. 3A to 3D.

Figure 3A:
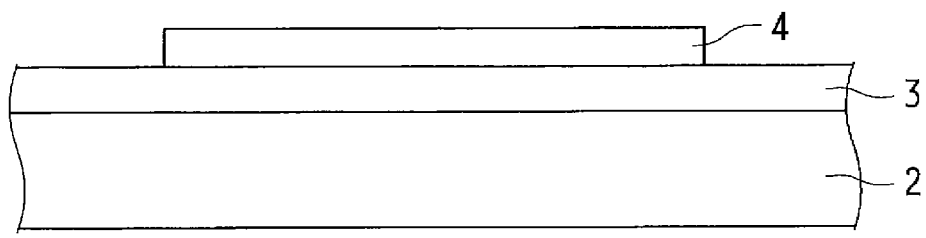
FIG. 3A is a schematic cross-sectional view illustrating the transistor in a semiconductor layer forming step.

FIG. 3A is a schematic cross-sectional view illustrating the transistor in a semiconductor layer forming step.

First, as illustrated in FIG. 3A, the first insulating film 3 is film-formed as an underlying insulating film on the substrate 2. For example, a glass substrate, a silicon substrate, and a plastic substrate (resin substrate) that has thermal resistance can be applied as the substrate 2. Polyethylene terephthalate (PET), polyethylene naphthalate (PEN), polyether sulfone (PES), acrylic resin, polyimide, and the like can be used as the material of the plastic substrate (resin substrate).

In the present embodiment, a $SiO_2$ film is film-formed by CVD, as the first insulating film 3 having a thickness of 375 nm. The first insulating film 3 is not limited thereto, and may be formed, for example, of silicon oxide (SiOx), silicon nitride (SiNx), silicon oxynitride (SiOxNy; x>y), silicon nitride oxide (SiNxOy; x>y), aluminum oxide, tantalum oxide, and the like. Alternatively, multiple layers may be layered to form the first insulating film 3.

Next, the oxide semiconductor layer 4 is film-formed on the first insulating film 3. The oxide semiconductor layer 4 is formed, for example, by a sputtering method, and is an In—Ga—Zn—O based semiconductor film having a thickness of 30 nm or greater and 100 nm or less. The oxide semiconductor layer 4 is patterned by a photolithography process and etching and thus is formed in a shape coinciding with each transistor 1.

Figure 3B:
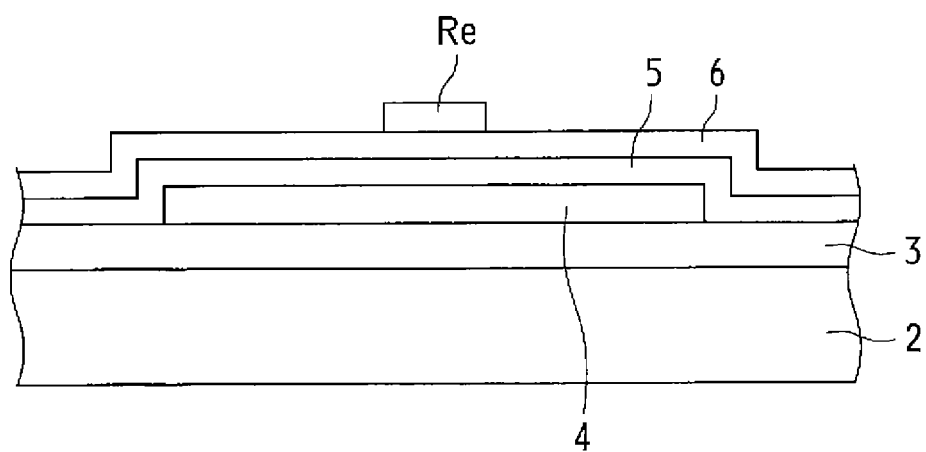
FIG. 3B is a schematic cross-sectional view illustrating the transistor in an upper gate forming step.

FIG. 3B is a schematic cross-sectional view illustrating the transistor in an upper gate forming step.

In the upper gate formation step, the gate insulating film 5 and a gate conductive film (corresponding to the upper gate electrode 6) are film-formed covering the oxide semiconductor layer 4 with respect to the state illustrated in FIG. 3A.

Specifically, the gate insulating film 5 is formed of silicon oxide (SiOx) film-formed by CVD to have a thickness of 80 nm or greater and 250 nm or less, for example, 150 nm. The gate insulating film 5 may be formed of the same material as the first insulating film 3, or may have a layered structure in which a plurality of layers are stacked.

The gate conductive film is film-formed by the sputtering method as a layered film of an Al film having a thickness of 350 nm as a lower layer and a MoN film having a thickness of 50 nm as an upper layer. The gate conductive film is not limited thereto, and may be formed, for example, of a metal film containing an element selected from aluminum (Al), tungsten (W), molybdenum (Mo), tantalum (Ta), chromium (Cr), titanium (Ti), and copper (Cu), or of an alloy film containing these elements as components thereof. Alternatively, the gate conductive film may be formed of a layered film containing a plurality of films of these films.

A resist mask Re patterned by the photolithography process is formed on the gate conductive film. The resist mask Re is provided at a portion overlapped with the upper gate electrode 6 illustrated in FIGS. 1 and 2, and covers only a portion of the gate conductive film.

Figure 3C:
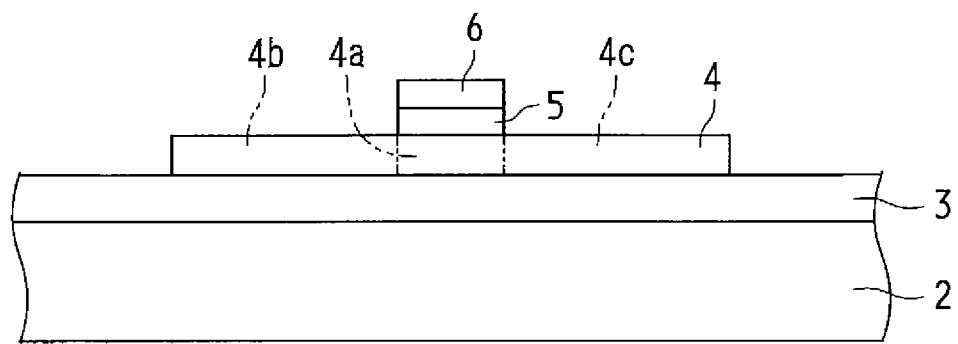
FIG. 3C is a schematic cross-sectional view illustrating the transistor in an etching step.

FIG. 3C is a schematic cross-sectional view illustrating the transistor in an etching step.

In the etching step, etching (for example, dry etching) of the gate conductive film and the gate insulating film 5 is performed simultaneously with respect to the state illustrated in FIG. 3B. Etching is simultaneously performed by using the same resist mask Re, and thus a portion of the gate conductive film, which is not covered by the resist mask Re is removed, and the upper gate electrode 6 of the portion illustrated in FIG. 3C remains. Then, a portion of the gate insulating film 5, which is covered by the removed gate conductive film is etched, and thus the gate insulating film 5 of the portion illustrated in FIG. 3C remains. As a result, the patterning shape of the upper gate electrode 6 is aligned with the patterning shape of the gate insulating film 5.

Note that alignment here does not imply exactly matching, but also includes a dimensional tolerance of approximately several μm caused by differences in etching rate or the like. After completion of etching of the gate conductive film and the gate insulating film 5, the resist mask Re may be removed as appropriate. As just described, the patterning shape of the upper gate electrode 6 is aligned with the patterning shape of the gate insulating film 5, and thus the self-alignment structure can be formed. As a result, the process is simplified, and in addition, both the upper gate electrode 6 and the gate insulating film 5 are accurately positioned to each other.

After the upper gate electrode 6 and the gate insulating film 5 are formed, a plasma treatment is performed on the entire surface of the substrate 2 from above the upper gate electrode 6. The plasma treatment is, for example, a hydrogen plasma treatment, a He plasma treatment, or the like. In the plasma treatment, the upper gate electrode 6 functions as a mask, and only the resistance of a portion of the oxide semiconductor layer 4, which is not covered by the upper gate electrode 6 is reduced. In other words, the resistance of the channel region 4a directly below the upper gate electrode 6 is not reduced, and the resistance of the source region 4b and the resistance of the drain region 4c are reduced.

Figure 3D:
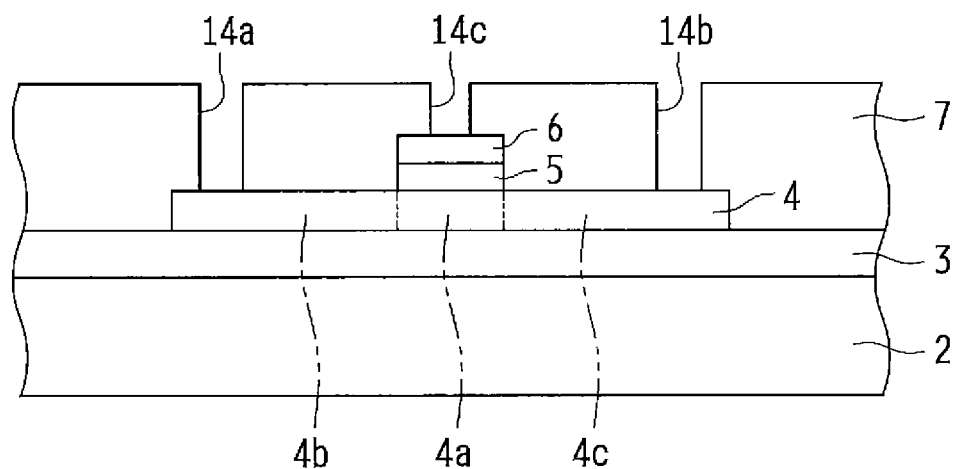
FIG. 3D is a schematic cross-sectional view illustrating the transistor in an interlayer film forming step.

FIG. 3D is a schematic cross-sectional view illustrating the transistor in an interlayer film forming step.

In the interlayer film forming step, the second insulating film 7 covering the oxide semiconductor layer 4, the first insulating film 3, and the upper gate electrode 6 is film-formed with respect to the state illustrated in FIG. 3C. The second insulating film 7 is formed of the same material and by the same method as the first insulating film 3 to have a thickness, for example, 100 nm or greater and 500 nm or less. In the present embodiment, a SiNx film having a thickness of 100 nm and a $SiO_2$ film having a thickness of 300 nm are continuously film-formed as the second insulating film 7 by CVD.

Contact holes allowing a portion of the oxide semiconductor layer 4 and the upper gate electrode 6 to be exposed are formed in the second insulating film 7 by a known photolithography process. As illustrated in FIG. 2, a contact hole (first conductor contact hole 14a) corresponding to the source electrode 11a is located to overlap with the source region 4b, and a contact hole (second conductor contact hole 14b) corresponding to the drain electrode 11b is located to overlap with the drain region 4c. A contact hole (gate contact hole 14c) corresponding to the light blocking layer 9 is located to overlap with the upper gate electrode 6 overlapping with the channel region 4a in plan view. In other words, since the channel region 4a of the oxide semiconductor layer 4 is entirely covered by the upper gate electrode 6, connection is ensured with the gate contact hole 14c being overlapped with the upper gate electrode 6. Thus, facilitate designing is achieved without needing to consider the position of the gate contact hole 14c. Note that, for the sake of description below, the first conductor contact hole 14a and the second conductor contact hole 14b may be referred to as a conductor contact hole.

After the interlayer film forming step, an electrode conductive film is film-formed on the second insulating film 7 and within the contact holes. A material illustrated as a gate conductive film can be applied to the electrode conductive film. In the present embodiment, a layered film is used in which a Ti film having a thickness of 30 nm is used as a lower layer, an Al film having a thickness of 300 nm is used as a main layer, and a Ti film having a thickness of 50 nm is used as an upper layer.

The electrode conductive film is patterned, and thus the transistor 1 illustrated in FIG. 1 is formed. In other words, the electrode conductive film filled into the first conductor contact hole 14a forms the source contact portion 10a, and the electrode conductive film filled into the second conductor contact hole 14b forms the drain contact portion 10b. The electrode conductive film filled into the gate contact hole 14c forms the gate contact portion 8. In addition, the electrode conductive film is patterned and thus is formed to have a shape separated as the source electrode 11a, the drain electrode 11b, and the light blocking layer 9.

Although not illustrated, a protective layer (or a flattening film) may be provided to cover the upper surface (the side on which the source electrode 11a and the drain electrode 11b are formed) of the transistor 1, and a pixel electrode or the like may be provided on the protective layer.

As illustrated in FIG. 2, the source electrode 11a (source region 4b) and the drain electrode 11b (drain region 4c) are located opposed to each other in the channel length direction L, and the upper gate electrode 6 (channel region 4a) is provided between the source electrode 11a and the drain electrode 11b. In other words, the upper gate electrode 6 is formed in a shape extended in the channel width direction W separating the source region 4b and the drain region 4c. The light blocking layer 9 is located to overlap with the upper gate electrode 6, and protrudes outward of the upper gate electrode 6 in the channel length direction L. In the present embodiment, the length of the upper gate electrode 6 in the channel length direction L is 4 μm, and the light blocking layer 9 protrudes from the upper gate electrode 6 by approximately from 3 to 10 μm. In addition, the light blocking layer 9 is preferably formed in a shape protruding outward from the channel region 4a in the channel width direction W. As just described, the light blocking layer 9 is formed protruding larger in width than the upper gate electrode 6, and thus the incident of light into the oxide semiconductor layer 4 can be more surely blocked.

The upper gate electrode 6 is extended outward of the channel region 4a in a plan view, and is, for example, a gate wiring line connected to another transistor 1 or the like. The upper gate electrode configured to linearly extend along the channel width direction W is illustrated in FIG. 2, but not limited thereto. Alternatively, the extension direction may be changed in accordance with the position of the object to which the upper gate electrode is connected. In addition, the object to which the upper gate electrode 6 is connected as a gate wiring line will be described in detail with reference to FIG. 12 described below.

Further, the light blocking layer 9 is formed in an island shape corresponding to the oxide semiconductor layer 4. In other words, in the present embodiment, the light blocking layer 9 is separately provided for each transistor 1 and is not extended to connect to another transistor 1 and the like.

In a display device including the transistor 1, for example, the light generated in a light-emitting layer or the like may be directly irradiated toward the transistor 1 or may be reflected to be irradiated toward the transistor 1. Even when the transistor 1 is simply irradiated with light, no failure occurs in the oxide semiconductor layer 4 (in particular, the channel region 4a), an end surface of each film is affected by the incident light and when the light enters the transistor while the current is flowing, the transistor may be charged to cause a malfunction.

In contrast, in the present embodiment, the light blocking layer 9 is provided, and thus the light incident (for example, incident light A illustrated in FIG. 1) into the oxide semiconductor layer 4 directly below the upper gate electrode 6 is blocked, and stable characteristics can be achieved. Furthermore, the light blocking layer 9 is electrically connected to the upper gate electrode 6, and the same potential as the upper gate electrode 6 is applied, therefore, a floating electrode is avoided from being formed.

In addition, the light blocking layer 9 is provided in the same layer as the source electrode 11a and the drain electrode 11b, and thus the both electrodes can be formed in the same process, and the manufacturing process can be simplified.

The oxide semiconductor layer 4 is not limited to the material described above, but may be formed of another material. The oxide semiconductor included in the oxide semiconductor layer 4 may be, for example, an amorphous oxide semiconductor (non-crystalline oxide semiconductor), or may be a crystalline oxide semiconductor including a crystalline portion. Examples of the crystalline oxide semiconductor may include a polycrystalline oxide semiconductor, a microcrystalline oxide semiconductor, a crystalline oxide semiconductor in which the c-axis is oriented substantially perpendicular to the layer surface, and the like.

In addition, the oxide semiconductor layer 4 may include a layered structure of two or more layers. In this case, the oxide semiconductor layer 4 may include a non-crystalline oxide semiconductor layer and a crystalline oxide semiconductor layer. Alternatively, the oxide semiconductor layer may include a plurality of crystalline oxide semiconductor layers having different crystal structures, or may include a plurality of non-crystalline oxide semiconductor layers.

Next, the material, structure, and the like of the non-crystalline oxide semiconductor and the crystalline oxide semiconductor will be described in detail. The oxide semiconductor layer 4 may contain, for example, at least one metal element of indium (In), gallium (Ga), and zinc (Zn). In the present embodiment, an In—Ga—Zn—O based semiconductor (for example, indium gallium zinc oxide) is applied. Here, the In—Ga—Zn—O based semiconductor is a ternary oxide of In, Ga, and Zn, and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. The In—Ga—Zn—O based semiconductor may be an amorphous semiconductor or may be a crystalline semiconductor. A crystalline In—Ga—Zn—O based semiconductor in which the c-axis is oriented substantially perpendicular to the layer surface is preferable as the crystalline In—Ga—Zn—O based semiconductor.

A TFT including an In—Ga—Zn—O based semiconductor layer has a high mobility and a low leakage current compared with a-SiTFT, therefore, the TFT can be suitably applied as a transistor of the display device. Note that the display device will be described in detail with reference to FIG. 12 described below.

In place of the In—Ga—Zn—O based semiconductor, the oxide semiconductor layer 4 may include another oxide semiconductor, and may include, for example, an In—Sn—Zn—O based semiconductor. The In—Sn—Zn—O based semiconductor is a ternary oxide of In, tin (Sn), and Zn, and examples thereof may include $In_2O_3$—$SnO_2$—ZnO (InSnZnO) and the like.

Alternatively, the oxide semiconductor layer 4 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), cadmium zinc oxide ($Cd_xZn_{1-x}O$), and the like. A substance of ZnO, to which one or more impurity elements of a 1 group element, a 13 group element, a 14 group element, a 15 group element, or a 17 group element are added, in a non-crystalline (amorphous) state, in a polycrystalline state or in a microcrystalline state where a non-crystalline state and a polycrystalline state are mixed, or a substance of ZnO to which no impurity element is added can be used as the Zn—O based semiconductor.

Second Embodiment

Next, the transistor according to a second embodiment of the disclosure will be described with reference to the drawings. Note that, in the second embodiment, components having substantially identical functions to those of the first embodiment are assigned with the same reference signs, and descriptions thereof will be omitted.

Figure 4:
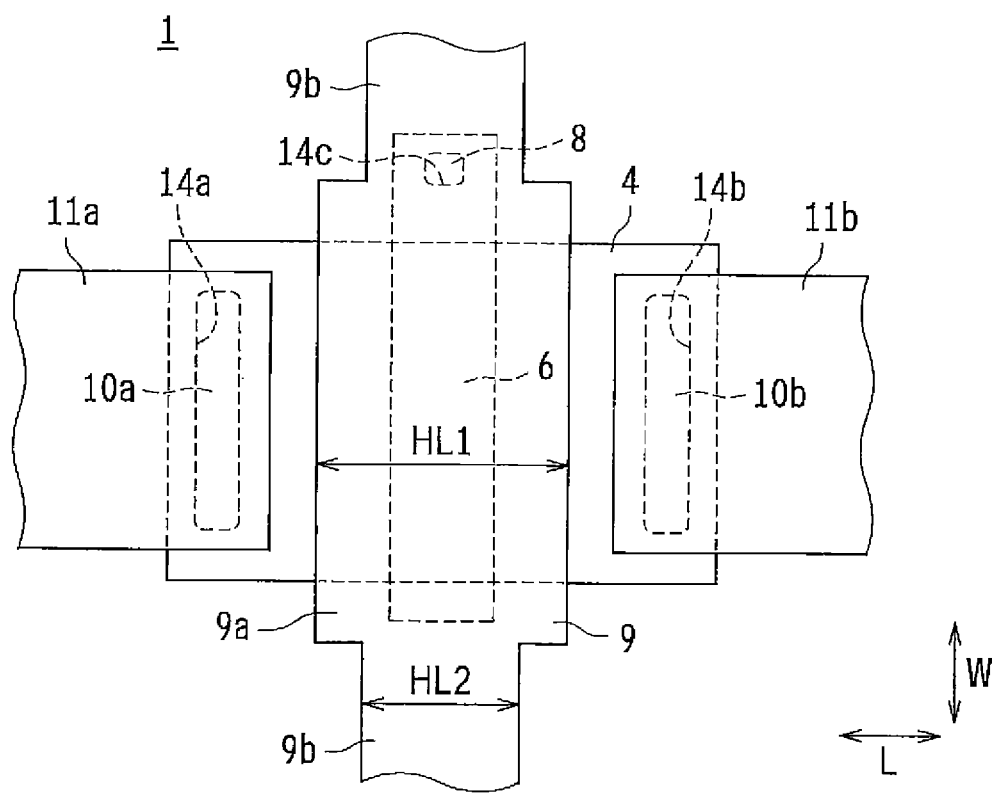
FIG. 4 is a schematic plan view schematically illustrating the transistor according to a second embodiment of the disclosure.

FIG. 4 is a schematic plan view schematically illustrating the transistor according to the second embodiment of the disclosure. Note that, in consideration of the visibility of the drawing, the second insulating film 7 is transparently illustrated in FIG. 4 in the same manner as in FIG. 2.

The second embodiment differs from the first embodiment in the shape of the upper gate electrode 6 and the shape of the light blocking layer 9 in plan view. Specifically, the upper gate electrode 6 remains extended to the position slightly outward of the channel region 4a. Instead of not elongating the upper gate electrode 6, the light blocking layer 9 is elongated to serve as a gate wiring line. Additionally, in plan view, the gate contact hole 14c is located to overlap with a portion of the upper gate electrode 6 extended to the position outward of the channel region 4a. Thus, even in a case where the upper gate electrode 6 is reduced in size due to the miniaturization of the transistor 1, the size reduction does not need to be considered in a connection section with the gate contact hole 14c provided outward of the channel region 4a. Therefore, a potential can be surely applied to the light blocking layer 9.

The light blocking layer 9 includes a light blocking main portion 9a overlapping with the channel region 4a, and extended portions 9b extended outward of the channel region 4a. The light blocking main portion 9a has a line width (length in the channel length direction L) different from that of the extended portion 9b. Specifically, the line width (first line width HL1) of the light blocking main portion 9a is formed greater than the line width (second line width HL2) of the extended portion 9b. Note that the line width of the light blocking main portion 9a and the line width of the extended portion 9b are not limited the lengths above, and the light blocking main portion 9a and the extended portion 9b may be formed to have the same line width. In addition, the object to which the light blocking layer 9 is connected as a gate wiring line will be described in detail with reference to FIG. 12 described below.

Third Embodiment

Next, the transistor according to a third embodiment of the disclosure will be described with reference to the drawings. Note that, in the third embodiment, components having substantially identical functions to those of the first embodiment and the second embodiment are assigned with the same reference signs, and descriptions thereof will be omitted.

Figure 5:
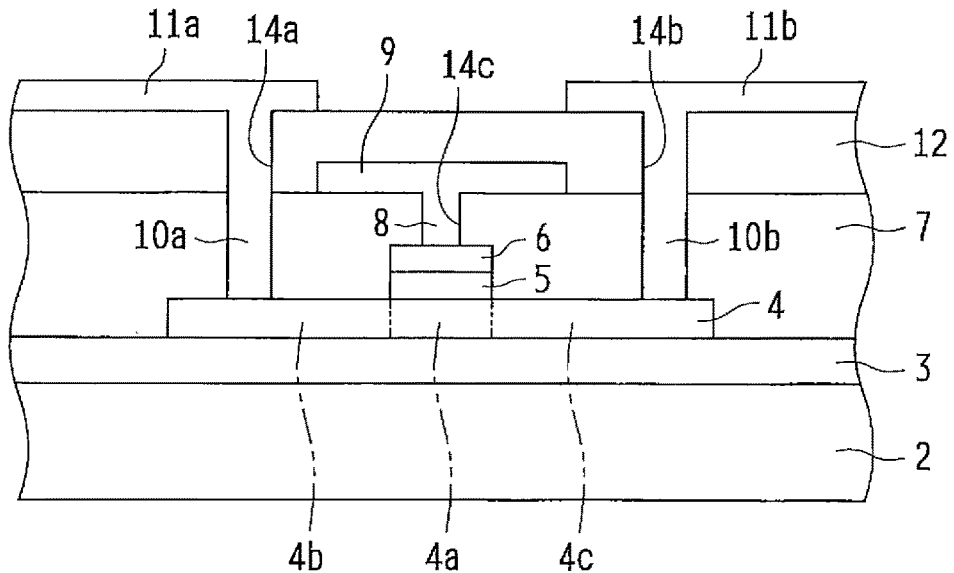
FIG. 5 is a schematic cross-sectional view schematically illustrating the transistor according to a third embodiment of the disclosure.
Figure 6:
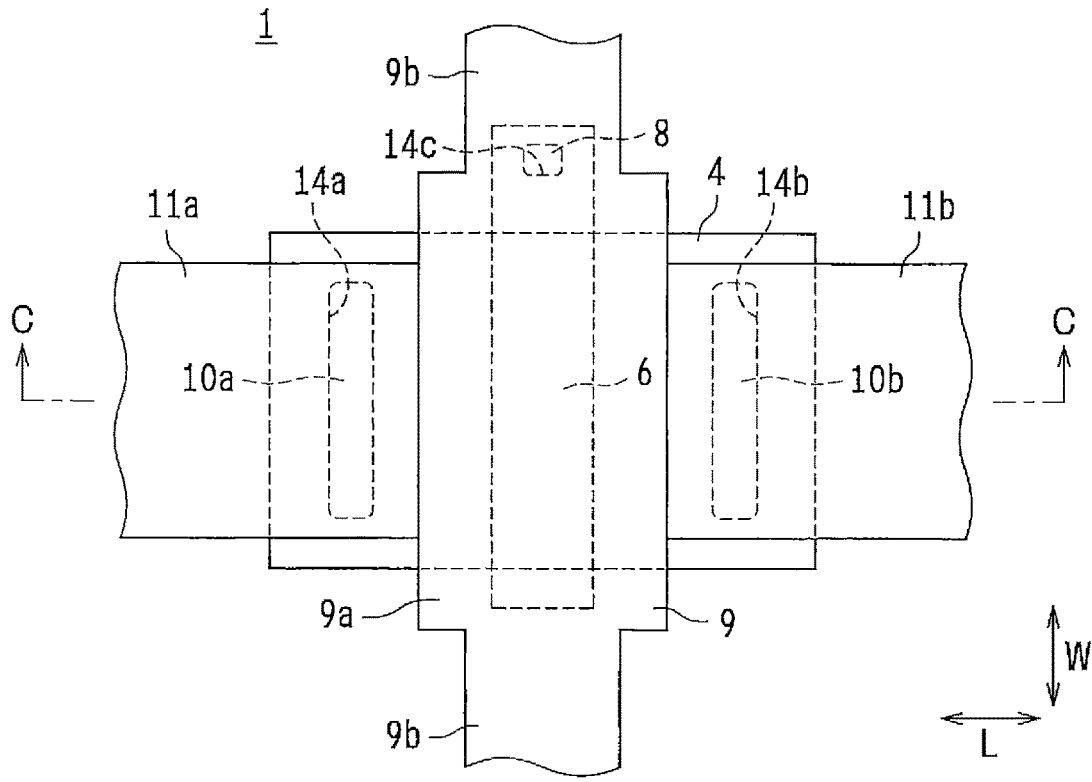
FIG. 6 is a schematic plan view schematically illustrating the transistor illustrated in FIG. 5.

FIG. 5 is a schematic cross-sectional view schematically illustrating the transistor according to the third embodiment of the disclosure. FIG. 6 is a schematic plan view schematically illustrating the transistor illustrated in FIG. 5. Note that, in consideration of the visibility of the drawings, hatching is omitted in FIG. 5, and the second insulating film 7 and a third insulating film 12 are transparently illustrated in FIG. 6. In addition, FIG. 5 illustrates a cross-section taken along the arrow C-C in FIG. 6.

The third embodiment differs from the second embodiment in that the third insulating film 12 is layered on the second insulating film 7. Specifically, the third insulating film 12 is formed to cover the upper gate electrode 6 and the second insulating film 7, and the source electrode 11a and the drain electrode 11b are layered on the third insulating film 12. In addition, the contact hole (first conductor contact hole 14a) corresponding to the source electrode 11a, and the contact hole (second conductor contact hole 14b) corresponding to the drain electrode 11b are located to extend through the second insulating film 7 and the third insulating film 12. The source contact portion 10a is filled into the first conductor contact hole 14a, and the drain contact portion 10b is filled into the second conductor contact hole 14b. The third insulating film 12 is formed of the same material and by the same method as the first insulating film 3 and the second insulating film 7.

As illustrated in FIG. 6, in plan view, on the side the light blocking layer 9 and the source electrode 11a face each other, the respective end portions of the upper gate electrode 6 and the source electrode 11a are approximately in contact with each other in the channel length direction L. However, since the light blocking layer 9 and the source electrode 11a are provided in different layers, the both electrodes are not electrically connected. Note that the positional relationship between the light blocking layer 9 and the drain electrode 11b is substantially the same as the positional relationship between the light blocking layer 9 and the source electrode 11a, and thus description thereof will be omitted.

In the present embodiment, in the interlayer film forming step illustrated in FIG. 3D, after the second insulating film 7 is layered, only the light blocking layer 9 is formed, and the source electrode 11a and the drain electrode 11b are formed in a different step. In other words, after the third insulating film 12 is layered on the light blocking layer 9, the first conductor contact hole 14a and the second conductor contact hole 14b are formed. Then, the source electrode 11a and the drain electrode 11b are formed.

As described above, in a case where the source electrode 11a and the drain electrode 11b are formed in the same layer as the light blocking layer 9, a wide margin between the both electrodes needs to be secured in consideration of expansion (for example, in the channel length direction L) to be generated in the manufacturing process such that the electrodes are surely separated from each other. For such a need, the third insulating film 12 is layered on the second insulating film 7, and thus the position in the thickness direction is adjusted and the source electrode 11a and the drain electrode 11b are prevented from interfering with other layers. Therefore, the flexibility of design can be improved. In other words, for example, the source electrode 11a and the drain electrode 11b are located close to the light blocking layer 9 and thus are consolidated in a narrow area. Therefore, the transistor 1 can be compactly formed.

Note that the position of the source electrode 11a and the position of the drain electrode 11b are not limited the aforementioned positions, and may be shifted further toward the upper gate electrode 6. Next, a modified example of the third embodiment in which the position of the source electrode 11a and the position of the drain electrode 11b are changed will be described with reference to the drawings.

Figure 7:
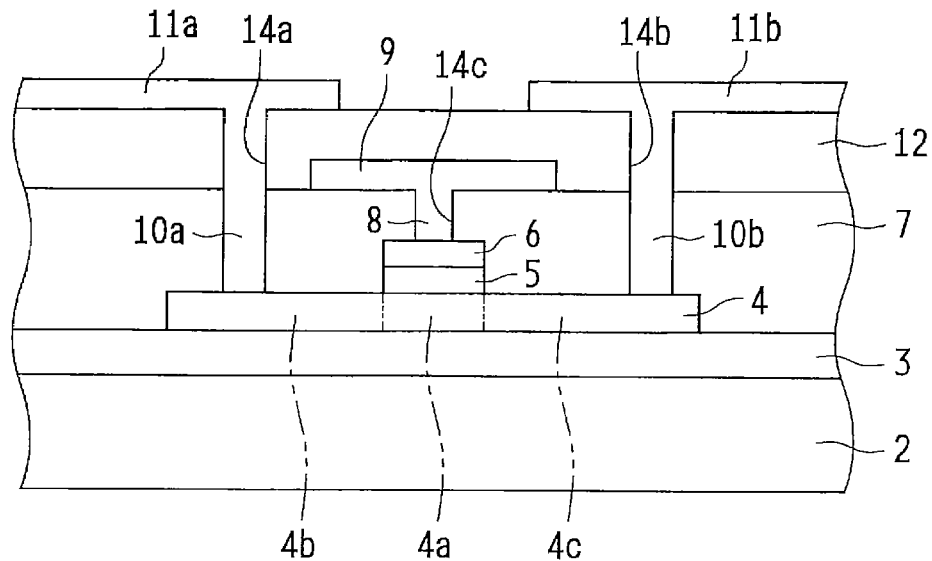
FIG. 7 is a schematic cross-sectional view schematically illustrating the transistor according to a modified example of the third embodiment of the disclosure.
Figure 8:
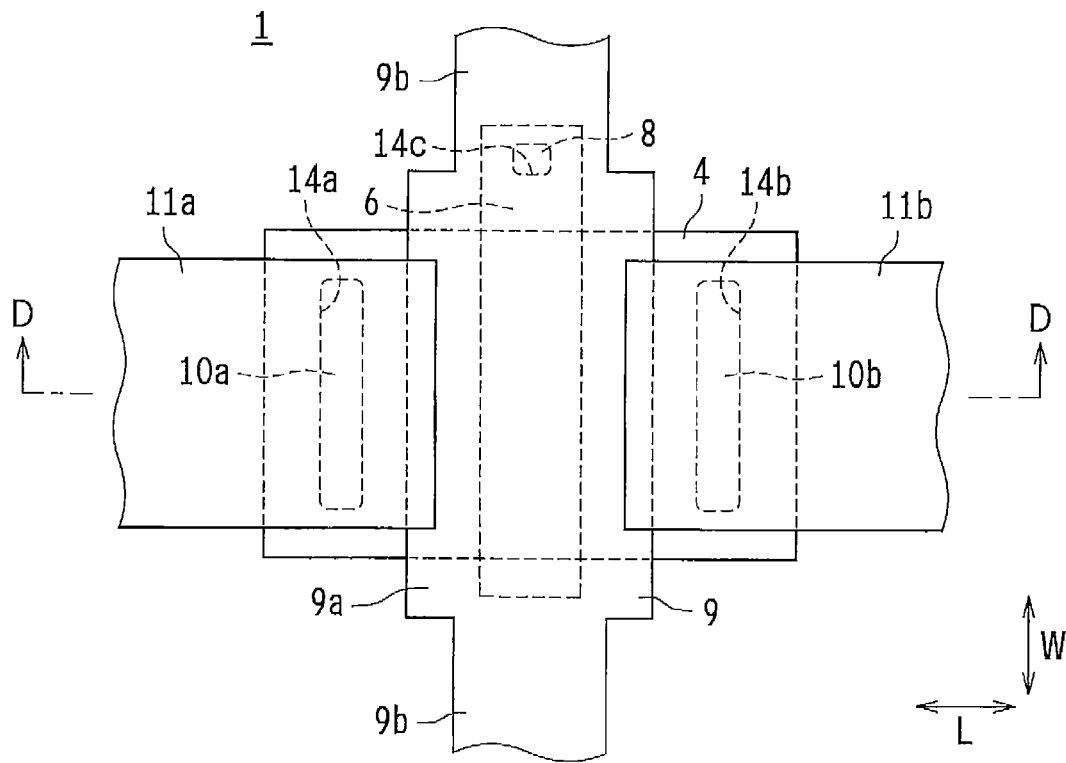
FIG. 8 is a schematic plan view schematically illustrating the transistor illustrated in FIG. 7.

FIG. 7 is a schematic cross-sectional view schematically illustrating the transistor according to the modified example of the third embodiment of the disclosure. FIG. 8 is a schematic plan view schematically illustrating the transistor illustrated in FIG. 7. Note that, in consideration of the visibility of the drawings, hatching is omitted in FIG. 7, and the second insulating film 7 and the third insulating film 12 are transparently illustrated in FIG. 8. In addition, FIG. 7 illustrates a cross-section taken along the arrow D-D in FIG. 8.

In the modified example, the source electrode 11a and the drain electrode 11b are shifted further toward the upper gate electrode 6 compared with the configuration illustrated in FIG. 7. As a result, the source electrode 11a and the drain electrode 11*b* include regions overlapping with the light blocking layer 9 in plan view. Even when overlapping with the light blocking layer 9 as just described, the source electrode 11*a* and the drain electrode 11*b* are formed in different layers from the light blocking layer 9 and thus do not interfere with each other. The source electrode 11*a* and the drain electrode 11*b* are consolidated to the positions overlapping with the light blocking layer 9. therefore, the size of the transistor 1 can be further reduced. Additionally, in plan view, exposed portions of the second insulating film 7 are respectively covered between the source electrode 11*a* and the light blocking layer 9 and between the drain electrode 11*b* and the light blocking layer 9. Thus, the light can also be blocked by the source electrode 11*a* and the drain electrode 11*b*. Consequently, the transistor 1 can be prevented from deteriorating.

Fourth Embodiment

Next, the transistor according to a fourth embodiment of the disclosure will be described with reference to the drawings. Note that, in the fourth embodiment, components having substantially identical functions to those of the first to third embodiments are assigned with the same reference signs, and descriptions thereof will be omitted.

Figure 9:
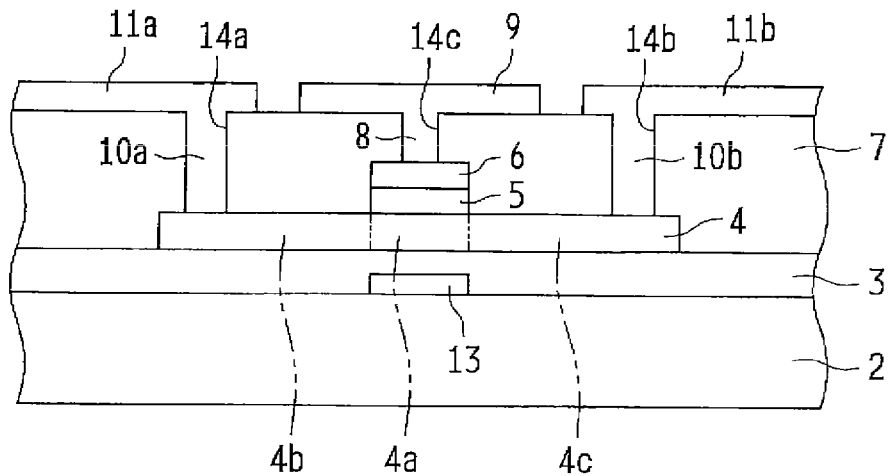
FIG. 9 is a schematic cross-sectional view schematically illustrating the transistor according to a fourth embodiment of the disclosure.

FIG. 9 is a schematic cross-sectional view schematically illustrating the transistor according to the fourth embodiment of the disclosure. Note that, in consideration of the visibility of the drawing, hatching is omitted in FIG. 9.

The fourth embodiment differs from the first embodiment in that a lower gate electrode 13 is provided. Specifically, the lower gate electrode 13 is formed on the substrate 2 and is covered by the first insulating film 3. The lower gate electrode 13 is located facing to the oxide semiconductor layer 4 by interposing the first insulating film 3 and overlaps with the channel region 4*a* of the oxide semiconductor layer 4 in plan view. The lower gate electrode 13 is provided as just described, and thus a double gate structure can be formed, and the characteristics of the transistor 1 can be improved.

Fifth Embodiment

Next, the transistor according to a fifth embodiment of the disclosure will be described with reference to the drawings. Note that, in the fifth embodiment, components having substantially identical functions to those of the first to fourth embodiments are assigned with the same reference signs, and descriptions thereof will be omitted.

Figure 10:
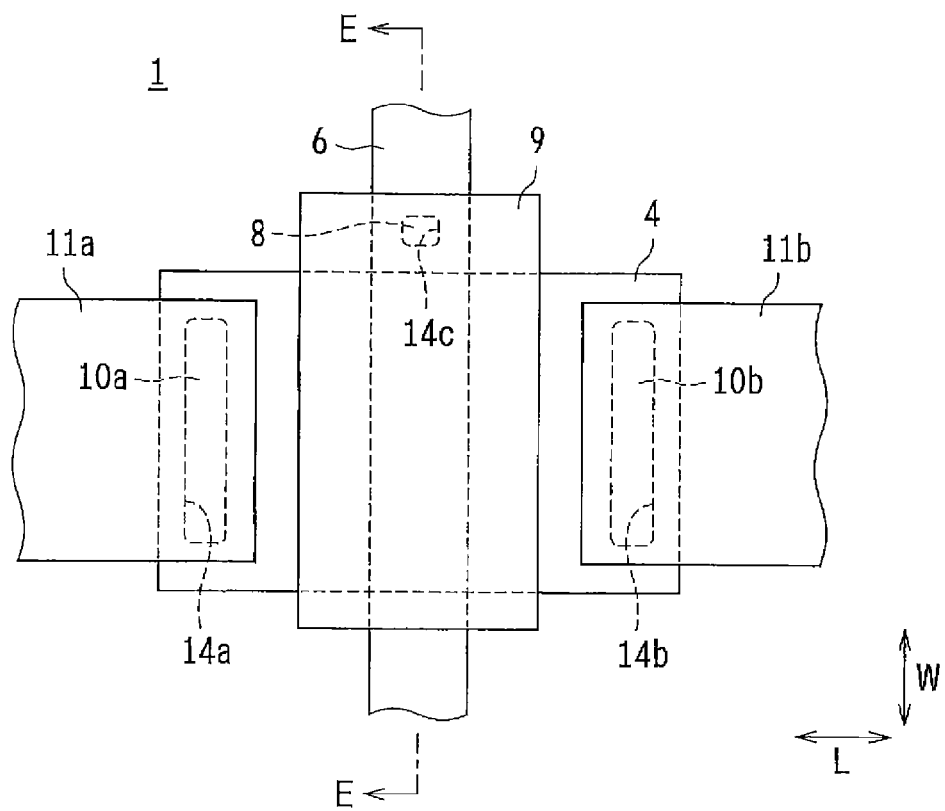
FIG. 10 is a schematic plan view schematically illustrating the transistor according to a fifth embodiment of the disclosure.
Figure 11:
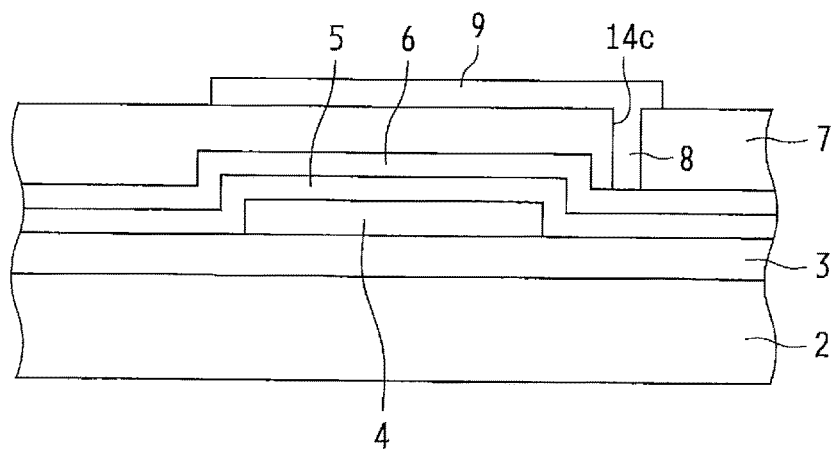
FIG. 11 is a schematic cross-sectional view schematically illustrating the transistor illustrated in FIG. 10.

FIG. 10 is a schematic plan view schematically illustrating the transistor according to the fifth embodiment of the disclosure. FIG. 11 is a schematic cross-sectional view schematically illustrating the transistor illustrated in FIG. 10. Note that, in consideration of the visibility of the drawing, hatching is omitted in FIG. 11, and the second insulating film 7 is transparently illustrated in FIG. 10. In addition, FIG. 11 illustrates a cross-section taken along the arrow E-E in FIG. 10.

The fifth embodiment differs from the first embodiment in the position of the gate contact hole 14*c*. Specifically, the gate contact hole 14*c* is located to overlap with a portion of the upper gate electrode 6, which is extended to the outer side of the channel region 4*a* in plan view in the same manner as in the second embodiment.

In the present embodiment, the light blocking layer 9 is formed in an island shape corresponding to the oxide semiconductor layer 4 in the same manner as in the first embodiment. In other words, in the present embodiment, the light blocking layer 9 is separately provided for each transistor 1, and is not extended to connect to another transistor 1 or the like. The upper gate electrode 6 is extended to connect to another transistor 1.

Display Device

Next, the display device including the transistor will be described with reference to the drawings.

Figure 12:
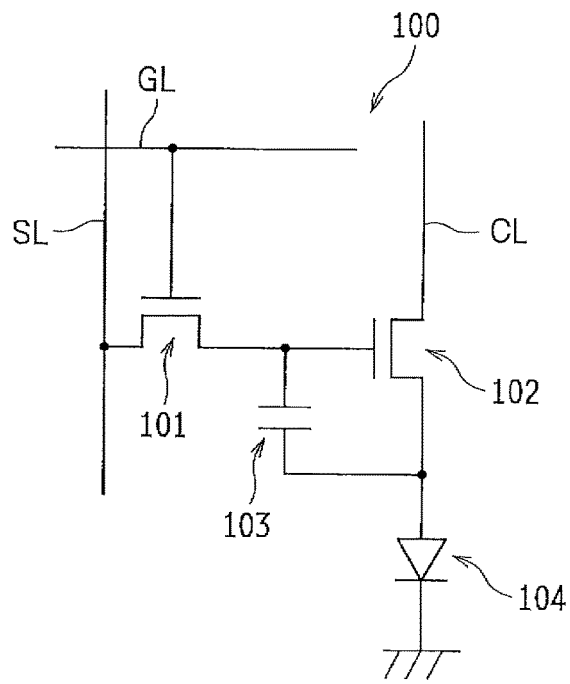
FIG. 12 is an equivalent circuit diagram illustrating a pixel circuit of a display device.

FIG. 12 is an equivalent circuit diagram illustrating a pixel circuit of the display device.

The display device includes a display region formed of a plurality of pixels arranged in a matrix. The plurality of pixels typically includes red pixels that display red, green pixels that display green, and blue pixels that display blue. The display device is provided with a pixel circuit 100 for each of the plurality of pixels. In FIG. 12, an example of a plurality of pixel circuits 100 is illustrated.

The pixel circuit 100 includes a selecting transistor 101, a drive transistor 102, and a capacitance element 103 (holding capacitor). The selecting transistor 101 and the drive transistor 102 are supported by the aforementioned substrate 2, and each of the selecting transistor 101 and the drive transistor 102 is an oxide semiconductor TFT including the oxide semiconductor layer 4.

The selecting transistor 101 includes a gate electrode connected to a gate signal line GL, a source electrode connected to a source wiring line SL, and a drain electrode connected to a gate electrode of the drive transistor 102 and the capacitance element 103. The drive transistor 102 includes a source electrode connected to a current supply line CL that electrically connects to an anode, and a drain electrode connected to a light-emitting diode 104 (OLED). The light-emitting diode 104 includes a conduction terminal connected to a cathode.

The selecting transistor 101 is turned on when an on signal is supplied from the gate signal line GL to the gate electrode of the selecting transistor 101. At this time, the signal voltage (corresponding to the desired light emission luminance of the light-emitting diode 104) from the source wiring line SL is applied via the selecting transistor 101 to the capacitance element 103 and the gate electrode of the drive transistor 102. The drive transistor 102 is turned on by the signal voltage. As a result, the current from the current supply line CL flows via the drive transistor 102 to the light-emitting diode 104, and the light-emitting diode 104 emits light.

The transistor 1 according to the first to fourth embodiments may be applied, for example, to the drive transistor 102 of the pixel circuit 100. In particular, the current flows to the drive transistor 102 of the pixel circuit 100 for a long period of time, therefore, a characteristic shift when the light enters the transistor is considered to be large. Therefore, the transistor 1 provided with the light blocking layer 9 is applied, and thus stable characteristics can be obtained. In a case where the light blocking layer 9 and the upper gate electrode 6 are gate wiring lines, the light blocking layer 9 and the upper gate electrode 6 are extended to be connected to the capacitance element 103 and the drain electrode of the selecting transistor 101. Note that when the transistor 1 is applied to another part, the object to be connected may be selected as appropriate.

The display device according to the present embodiment may be a transparent display device. In other words, the surface side that displays an image or the like is transparent so that the light of the light-emitting diode 104 or the like can be seen. Meanwhile, the back side opposed to the surface side is normally provided with a substrate having light blocking properties. In contrast, the substrate on the back surface is designed to be semi-transparent, and thus the transparent display device allowing the back surface side to be seen from the front surface side can be provided. Note that the display region of the display device is configured such that one region where the electrodes other than the transistor 1, the wiring lines, and the transparent electrodes are formed maintains light blocking properties and such that the other region than the region having the light blocking properties allows penetration of light, therefore, the display region can be a semi-transparent display region as a whole.

The display device according to the present embodiments is not particularly limited as long as the display device is a display panel including a display element. The display element includes a display element having luminance and transmittance which are controlled by current, and a display element having luminance and transmittance which are controlled by voltage. Examples of the display element controlled by current include, for example, an organic electroluminescence (EL) display provided with an organic light-emitting diode (OLED), EL display such as an inorganic EL display provided with an inorganic light-emitting diode, a quantum dot light-emitting diode (QLED) display provided with a QLED, and the like. Further, there is a liquid crystal display element or the like as the display element controlled by voltage.

Note that the embodiments disclosed herein are illustrative in all respects and are not a rational for limited interpretation. Therefore, the technical scope of the disclosure is not to be construed only by the aforementioned embodiments, but is defined based on the description of the claims. In addition, all changes within the claims and within the meaning and range of equivalence are included.

The invention claimed is:

1. A transistor including a first insulating film, an oxide semiconductor layer, a gate insulating film, an upper gate electrode, and a second insulating film being sequentially layered on a substrate, the transistor comprising:
   a light blocking layer layered on the second insulating film and formed of metal,
   wherein the light blocking layer is electrically connected to the upper gate electrode by interposing a gate contact hole provided in the second insulating film,
   the oxide semiconductor layer is configured such that a region overlapping with the upper gate electrode entirely overlaps with the light blocking layer, and
   the transistor further comprises: a third insulating film layered on the second insulating film; and
   a source electrode and a drain electrode electrically connected to the oxide semiconductor layer by interposing a conductor contact hole provided in the second insulating film and the third insulating film.

2. The transistor according to claim 1, comprising:
   a source electrode and a drain electrode electrically connected to the oxide semiconductor layer by interposing a conductor contact hole provided in the second insulating film,
   wherein the light blocking layer is formed in the same layer as the source electrode and the drain electrode in a layered thickness direction.

3. The transistor according to claim 1,
   wherein the source electrode and the drain electrode are provided with regions overlapping with the light blocking layer in plan view.

4. The transistor according to claim 1,
   wherein the gate contact hole overlaps with a channel region of the oxide semiconductor layer.

5. The transistor according to claim 1,
   wherein the upper gate electrode is extended to the outer side of a channel region of the oxide semiconductor layer, and
   the gate contact hole overlaps with a portion of the upper gate electrode extended to the outer side of the channel region of the oxide semiconductor layer.

6. The transistor according to claim 1,
   wherein the upper gate electrode and the gate insulating film are aligned in plan view.

7. The transistor according to claim 1,
   wherein a lower gate electrode facing to the oxide semiconductor layer by interposing the first insulating film is formed below the oxide semiconductor layer, and
   the lower gate electrode overlaps with a channel region of the oxide semiconductor layer in plan view.

8. The transistor according to claim 1,
   wherein the light blocking layer is formed protruding outward of a region where the upper gate electrode and the oxide semiconductor layer overlap with each other in plan view.

9. The transistor according to claim 1,
   wherein the light blocking layer is formed in an island shape corresponding to the oxide semiconductor layer.

10. A display device comprising the transistor according to claim 1, the display device comprising a display region formed with a plurality of pixel circuits corresponding to a plurality of pixels,
    wherein each of the plurality of pixel circuits includes a drive transistor formed of the transistor.

11. The display device according to claim 10,
    wherein the light blocking layer is a gate wiring line.

12. The display device according to claim 10,
    wherein the upper gate electrode is a gate wiring line.

13. The display device according to claim 10,
    wherein the display device is a transparent display device.

* * * * *